United States Patent
Wu et al.

(10) Patent No.: US 9,013,871 B2
(45) Date of Patent: Apr. 21, 2015

(54) ELECTRONIC DEVICE

(71) Applicants: Hsiang-Tien Wu, Taipei (TW); Chang-Yuan Wu, Taipei (TW); Jia-Yu Hung, Taipei (TW); Kai-Hsiang Tsao, Taipei (TW)

(72) Inventors: Hsiang-Tien Wu, Taipei (TW); Chang-Yuan Wu, Taipei (TW); Jia-Yu Hung, Taipei (TW); Kai-Hsiang Tsao, Taipei (TW)

(73) Assignee: Compal Electronics, Inc., Taipei (TW)

( * ) Notice: Subject to any disclaimer, the term of this patent is extended or adjusted under 35 U.S.C. 154(b) by 255 days.

(21) Appl. No.: 13/794,809

(22) Filed: Mar. 12, 2013

(65) Prior Publication Data

US 2013/0250515 A1    Sep. 26, 2013

Related U.S. Application Data

(60) Provisional application No. 61/614,498, filed on Mar. 22, 2012.

(51) Int. Cl.
*H05K 7/20* (2006.01)
*G06F 1/20* (2006.01)

(52) U.S. Cl.
CPC ........ *H05K 7/20154* (2013.01); *H05K 7/20145* (2013.01); *G06F 1/203* (2013.01)

(58) Field of Classification Search
CPC combination set(s) only.
See application file for complete search history.

(56) References Cited

U.S. PATENT DOCUMENTS

| | | | |
|---|---|---|---|
| 5,704,419 A * | 1/1998 | Agonafer et al. | 165/121 |
| 6,111,748 A | 8/2000 | Bhatia | |
| 6,847,524 B2 * | 1/2005 | Tomioka et al. | 361/695 |
| 2008/0112127 A1 * | 5/2008 | June et al. | 361/687 |
| 2012/0113593 A1 * | 5/2012 | Hsu et al. | 361/696 |
| 2012/0170209 A1 * | 7/2012 | Wang | 361/679.48 |

FOREIGN PATENT DOCUMENTS

TW    I267346    11/2006

* cited by examiner

*Primary Examiner* — Gregory Thompson
(74) *Attorney, Agent, or Firm* — Jianq Chyun IP Office

(57) ABSTRACT

An electronic device including a main body, a heat dissipation fan and at least one block is provided. The main body has a side shell and a bottom shell. The side shell has a first air inlet and a first air outlet. The heat dissipation fan is disposed in the main body and has at least one second air inlet and at least one second air outlet. The second air outlet is aligned to the first air outlet. The block is disposed in the main body to form a channel with the bottom shell and the dissipation fan. The channel is extended between the second air inlet and the first air inlet, so as to guide airflow to pass through the first air inlet and the second air inlet sequentially and enter the heat dissipation fan.

17 Claims, 8 Drawing Sheets

ELECTRONIC DEVICE

CROSS-REFERENCE TO RELATED APPLICATION

This application claims the priority benefits of U.S. provisional application Ser. No. 61/614,498, filed on Mar. 22, 2012. The entirety of the above-mentioned patent applications is hereby incorporated by reference herein and made a part of this specification.

BACKGROUND

1. Field of the Invention

The present invention is directed to an electronic device and more particularly, to an electronic device having a heat dissipation fan.

2. Description of Related Art

With the advance of electronic technology, various electronic products have been widely applied in our work and life. Electronic devices in the electronic products may generate heat during operations. Heat dissipation holes are generally formed on a casing of the electronic product to ensure the electronic devices to operate normally, such that heat-dissipation airflow is adapted to carry away heat generated during operations of the electronic apparatuses through said heat dissipation holes. Taking a notebook computer for example, a central processing unit (CPU) or other heat-generating elements therein may generate heat during operations, and therefore, it is required to dispose a heat dissipation fan within the notebook computer for heat dissipation.

In order for the heat-dissipation airflow generated by the heat dissipation fan to successfully dissipate the heat generated from the CPU and other heat-generating elements, it is required to form an air inlet and an air outlet in the casing of the notebook computer, such that the heat-dissipation airflow generated by the heat dissipation fan flows with the air inlet and the air outlet. In some specific designs of the notebook computer, the air outlet is formed on the side shell of the notebook computer, and the air inlet is formed on the bottom shell of the notebook computer. As a result, the appearance of the notebook computer is influenced by openings (i.e., the air inlet and the air outlet) on places of the casing.

FIG. 1 illustrates a heat dissipation fan of the related art (U.S. Pat. No. 6,111,748). As shown in FIG. 1, a heat dissipation fan has an air inlet 530 and an air outlet 540, and the air inlet 530 and the air outlet 540 are located at the same side of the heat dissipation fan. In the related art, the air inlet 530 and the air outlet 540 are concentrated at the same side of the heat dissipation fan. However, such design is only for the heat dissipation fan itself, and the problem that the appearance of the NB is influenced by openings on the places of the casing can not be improved. Moreover, in the related art, the air inlet 530 of the heat dissipation fan is disposed at the side surface, instead of the bottom surface or the top surface, and as a result, the air-intake efficiency is reduced.

SUMMARY

The present invention is directed to an electronic device capable of concentrating an air inlet and an air outlet of a chassis at the same side so as to provide the electronic device with a better appearance.

The present invention is directed to an electronic device, including a main body, a heat dissipation fan and at least one block. The main body has a side shell and a bottom shell. The side shell has a first air inlet and a first air outlet. The heat dissipation fan is disposed in the main body and has at least one second air inlet and at least one second air outlet. The second air outlet is aligned to the first air outlet. The block is disposed in the main body to form a channel with the bottom shell and the heat dissipation fan. The channel is extended between the second air inlet and the first air inlet to guide airflow to pass through the first air inlet and the second air inlet sequentially and enter the heat dissipation fan.

In an embodiment of the present invention, the electronic device includes a top shell, wherein the side shell is connected between the top shell and the bottom shell, and the second air inlet faces toward the top shell or the bottom shell.

In an embodiment of the present invention, the heat dissipation fan further comprises a third air inlet, and when the second air inlet faces toward the bottom shell, the third air inlet faces toward the top shell.

In an embodiment of the present invention, the bottom shell has no openings.

In an embodiment of the present invention, the block is adjacent to the heat dissipation fan and contacts the top shell and the bottom shell.

In an embodiment of the present invention, a gap is between the heat dissipation fan and the bottom shell, and the block is filled in the gap.

In an embodiment of the present invention, a material of the block is sponge, rubber or plastic.

In an embodiment of the present invention, the heat dissipation fan has a top surface, a bottom surface and a first side surface. The top surface is opposite to the bottom surface, the first side surface is connected between the top surface and the bottom surface, the second air outlet is formed on the first side surface, and the second air inlet is formed on the top surface or the bottom surface.

In an embodiment of the present invention, the side shell has a first shielding plate, and the first shielding plate tilts relative to the side shell to hide the first air outlet.

In an embodiment of the present invention, the side shell has a second shielding plate, and the second shielding plate tilts relative to the side shell to hide the first air inlet.

In an embodiment of the present invention, an included angle between the first shielding plate and the second shielding plate is greater than 30 degrees.

In an embodiment of the present invention, the first shielding plate guides the airflow passing through the first air outlet away from the first air inlet.

In an embodiment of the present invention, the electronic device further includes a heat dissipation fins assembly disposed between the second air outlet and the first air outlet.

In an embodiment of the present invention, the heat dissipation fins assembly tilts, such that the heat dissipation fins assembly guides the airflow passing through the heat dissipation fins assembly away from the first air inlet.

In an embodiment of the present invention, projections of the first air inlet and the first air outlet along an axial direction overlap with each other.

In an embodiment of the present invention, projections of the first air inlet and the first air outlet along an axial direction do not overlap with each other.

In an embodiment of the present invention, projections of the first air inlet and the first air outlet along an axial direction partially overlap with each other.

To sum up, the first air inlet and the first air outlet of the electronic device of the present invention are concentrated at the side shell so as to avoid the appearance being influenced by openings on places of the surfaces of the electronic device. In addition, the blocks are disposed in the electronic device to guide the airflow from the first air inlet at the side shell to the second air inlet of the heat dissipation fan. Thus, even though the air inlet of the heat dissipation fan is not aligned to the first air inlet of the side shell, a good heat dissipation effect may be achieved by the blocks guiding the airflow. Accordingly, a position of the inlet of the heat dissipation fan is not limited by the first air inlet of the electronic device disposed at the side shell, and the second air inlet may be disposed on a proper position (e.g., the bottom surface or the top surface of the heat dissipation fan) of the heat dissipation fan, such that the heat dissipation fan may have better air-intake efficiency.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
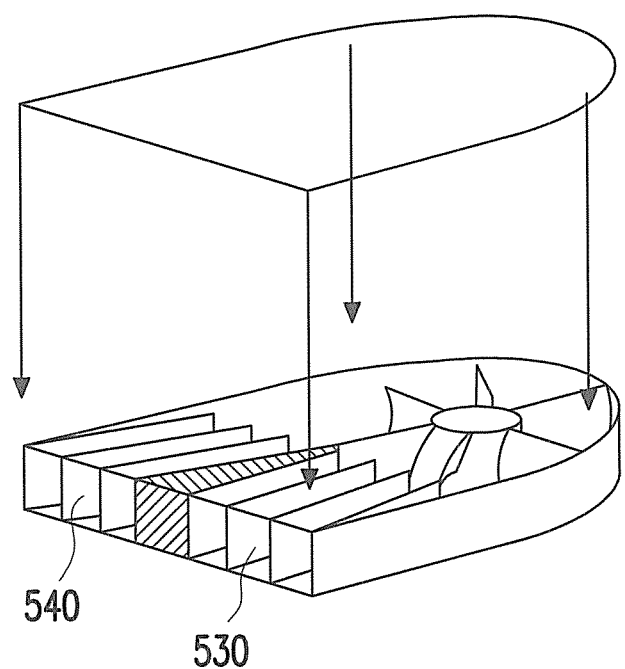
FIG. 1 illustrates a heat dissipation fan of the related art.
Figure 2:
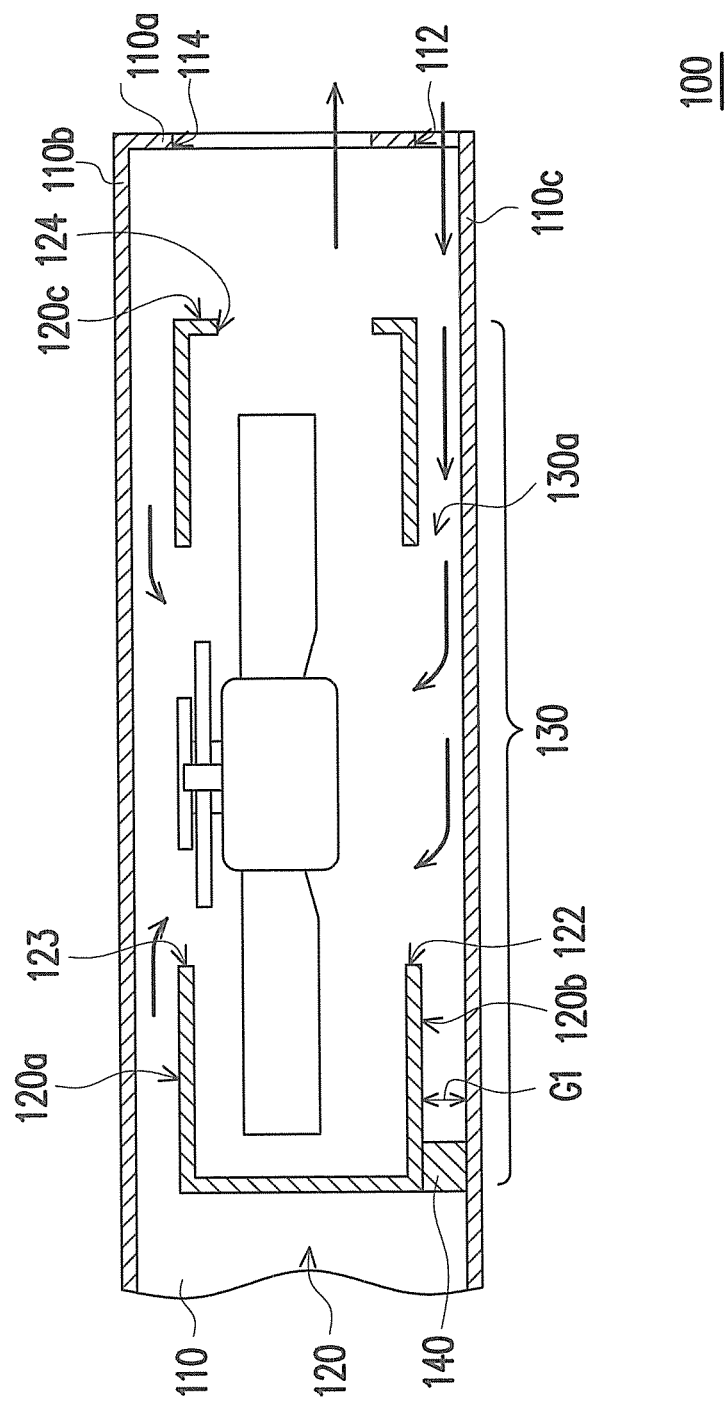
FIG. 2 is a partial schematic diagram illustrating an electronic device according to an embodiment of the present invention.

FIG. 2 is a partial schematic diagram illustrating an electronic device according to an embodiment of the present invention. Referring to FIG. 2, an electronic device 100 of the present embodiment is, for example, a notebook computer (NB) and includes a main body 110 and a heat dissipation fan 120. The main body 110 is, for example, a host of the NB and has a casing 130 having a side shell 110a. The side shell 110a has a first air inlet 112 and a first air outlet 114. The heat dissipation fan 120 is disposed in the main body 110 and serves to dissipate heat generated from heat-generating elements (e.g., the CPU) in the main body 110. The heat dissipation fan 120 has at least one second air inlet 122 and at least one second air outlet 124. The second air outlet 124 is aligned to the first air outlet 114, such that airflow from the heat dissipation fan 120 is guided to pass through the second air outlet 124 and the first air outlet 114 sequentially to the outside. A channel 130a may be formed between the casing 130 of the main body 110 and a casing of the heat dissipation fan 120. The channel 130a is extended between the second air inlet 122 and the first air inlet 112 to guide the airflow to pass through the first air inlet 112 and the second air inlet 122 sequentially to enter the heat dissipation fan 120.

Under the aforementioned configuration, the first air inlet 112 and the first air outlet 114 of the electronic device 100 are concentrated at the side shell 110a to avoid the appearance of the electronic device 100 being influenced by the openings on places of the surfaces of the electronic device 100. Additionally, the channel 130a is in the electronic device 100 and serves to guide the airflow from the first air inlet 112 of the side shell 110a to the second air inlet 122 of the heat dissipation fan 120. Thus, even though the third air inlet 123 of the heat dissipation fan 120 is not aligned to the first air inlet 112 of the side shell 110a, a good heat dissipation effect may be achieved by the channel 130a guiding the airflow. Accordingly, a position of the air inlet of the heat dissipation fan 120 is not limited by the first air inlet 112 of the electronic device 100 disposed at the side shell 110a, and the air inlet may be disposed on a proper position (e.g., a bottom surface 120b or a top surface 120a of the heat dissipation fan) of the heat dissipation fan 120, such that the heat dissipation fan 120 may have better air-intake efficiency.

Figure 3:
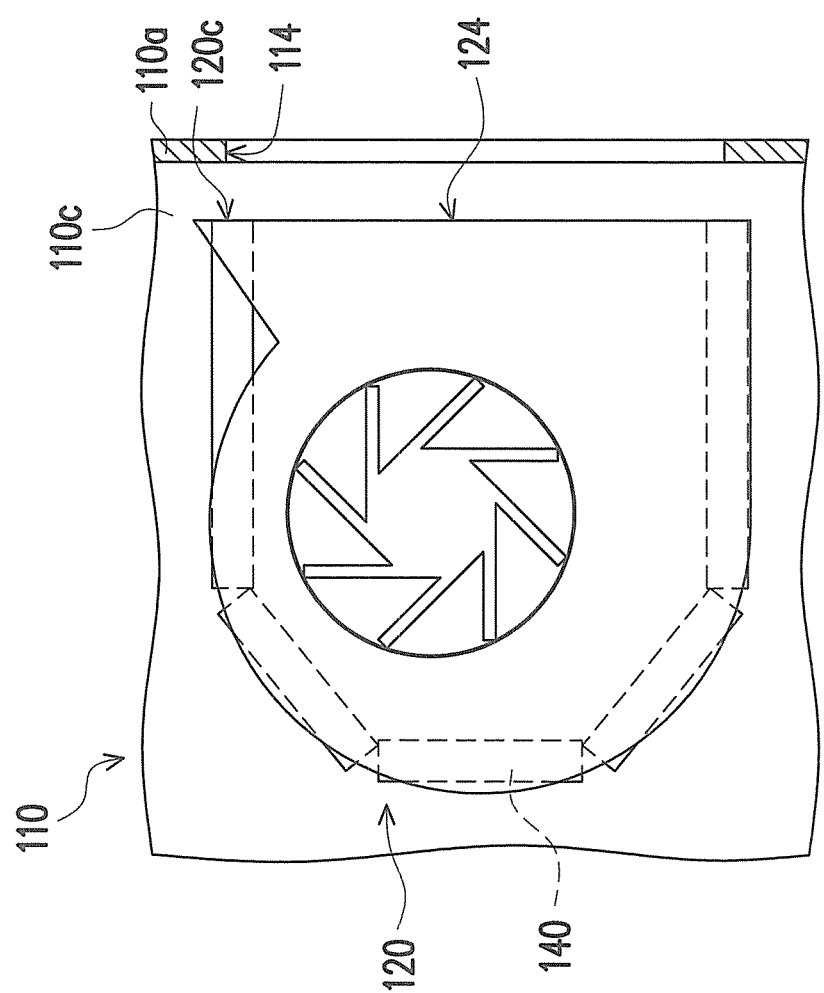
FIG. 3 is a top-view diagram illustrating the electronic device depicted in FIG. 2.

In detail, the casing 130 of the electronic device 100 of the present embodiment further includes a top shell 110b and a bottom shell 110c opposite to each other. The side shell 110a is connected between the top shell 110b and the bottom shell 110c. Referring to FIG. 2 and FIG. 3, since the first air inlet 112 and the first air outlet 114 of the electronic device 100 are concentrated and disposed at the side shell 110a, no air inlets and air outlets has to be disposed on the bottom shell 110c. Accordingly, the bottom shell 110c may be designed without any openings and have a better appearance. Moreover, since the bottom shell 110c does not have any air inlet, the air does not enter the electronic device 100 from the bottom thereof so as to avoid dusts from the outside being accumulated on the bottom of the electronic device 100 as the airflow flows. Besides, after cool air from the outside enters the electronic device 100 through the first air inlet 112, the cool air flows toward the second air inlet 122 of the heat dissipation fan 120 along the bottom shell 110c to dissipate the heat from the bottom shell 110c so as to avoid a user's discomfort resulted from an overly high temperature on the bottom of the electronic device 100. With different product designs, the channel 130a may be located either among the casing of the heat dissipation fan 120, the bottom shell 110c of the electronic device 100 and the side shell 110a of the electronic device 100 or among the casing of the heat dissipation fan 120, the top shell 110b of the electronic device 100 and the side shell 110a of the electronic device 100, which constructs no limitations to the present invention.

In the present embodiment, in addition to the top surface 120a and the bottom surface 120b, the heat dissipation fan 120 further has a first side surface 120c. The top surface 120a is opposite to the bottom surface 120b, the first side surface 120c is connected between the top surface 120a and the bottom surface 120b, and the second air outlet 124 is formed on the first side surface 120c of the heat dissipation fan 120 to be aligned to the first air outlet 114 of the side shell 110a. Additionally, the heat dissipation fan 120 may have the second air inlet 122 and the third air inlet 123, the second air inlet 122 is formed on the bottom surface 120b of the heat dissipation fan 120 and faces toward the bottom shell 110c of the casing 130 of the electronic device 100. The third air inlet 123 is formed on the top surface 120a of the heat dissipation fan 120 and faces toward the top shell 110b.

FIG. 3 is a top-view diagram illustrating the electronic device depicted in FIG. 2. For the clearness of the figure, the top shell 110b depicted in FIG. 2 is not illustrated in FIG. 3. Referring to FIG. 2 and FIG. 3, the electronic device 100 of the present embodiment further includes at least one block 140 (multiple ones are illustrated herein). A gap G1 is between the casing of the heat dissipation fan 120 and the casing 130 of the electronic device 100, and each block 140 is filled in the gap G1, such that the channel 130a is formed among the blocks 140, the casing 130 of the electronic device 100 and the casing of the heat dissipation fan 120. In the present embodiment, a material of the block 140 is, for example, sponge, rubber or plastic, such that the cool air successfully enters the heat dissipation fan 120 through the second air inlet 122 after entering the electronic device 100 from the first air inlet 112, without being diffused to other regions inside the electronic device 100 and reducing an air-intake volume of the heat dissipation fan 120. With different product designs, the block 140 may be integrated with the casing of the heat dissipation fan 120 or with the casing 130 of the electronic device 100. Alternatively, the block 140 may be respectively integrated with the casing of the heat dissipation fan 120 and the casing 130 of the electronic device 100 as individual elements. However, the present invention is not limited thereto.

The present invention is not intent to limit positions and forms of the channel 130a, and examples thereof will be illustrated with reference to the FIG. 4 through FIG. 6.

Figure 4:
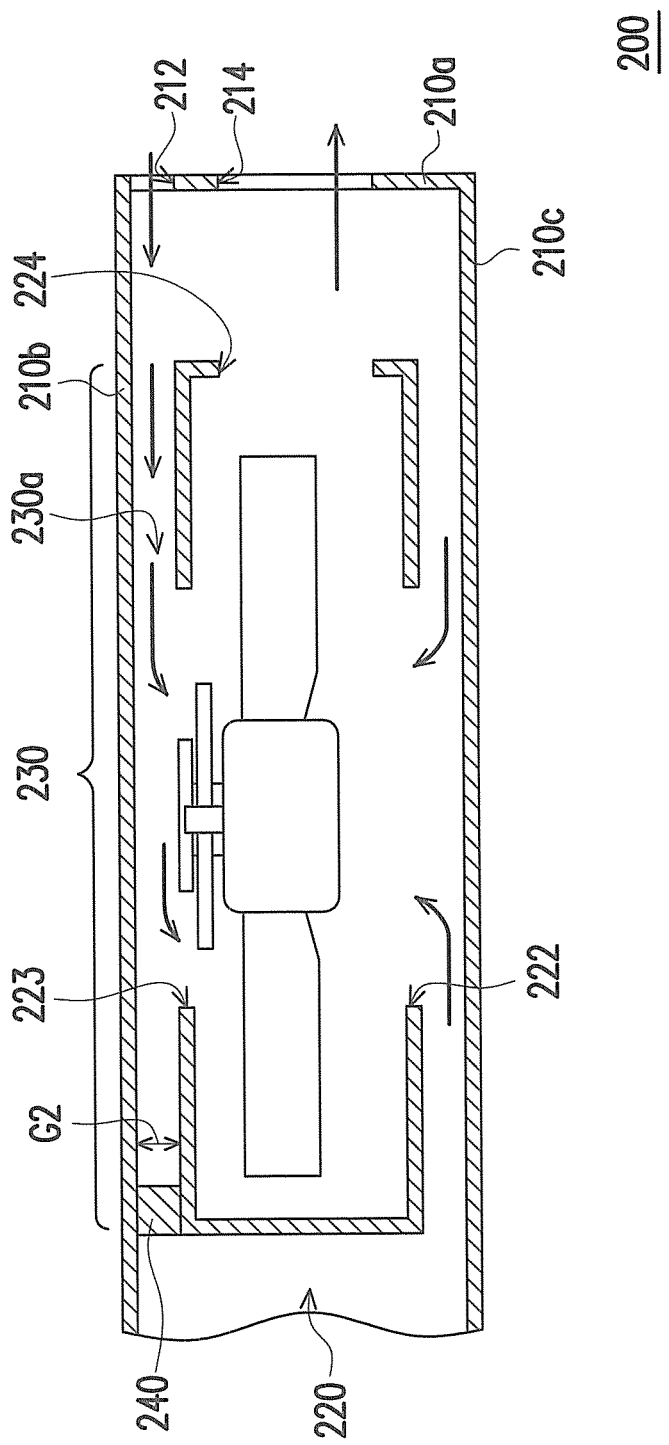
FIG. 4 is a partial schematic diagram illustrating an electronic device according to another embodiment of the present invention.

FIG. 4 is a partial schematic diagram illustrating an electronic device according to another embodiment of the present invention. Referring to FIG. 4, an electronic device 200 of the present embodiment is different from the electronic device 100 depicted in FIG. 2 in that a channel 230a of the present invention is located between a casing of a heat dissipation fan 220 and a top shell 210b of the electronic device 200 and between the casing of the heat dissipation fan 220 and a side shell 210a of the electronic device 200. The other configurations of the electronic device 200 are similar to those of the electronic device 100 and described as follows. A bottom shell 210c of the electronic device 200 is opposite to the top shell 210b. The heat dissipation fan 220 has a second air inlet 222 and a third air inlet 223 opposite to each other. A block 240 is filled in a gap G2 between the top shell 210b and the heat dissipation fan 220. As such, the channel 230a is formed among the block 240, a casing 230 of the electronic device 200 and the heat dissipation fan 220 and extended between the first air inlet 212 at the side shell 210a and the third air inlet 223 of the heat dissipation fan 220 to guide the airflow to pass through the first air inlet 212 and the third air inlet 223 sequentially to enter the heat dissipation fan 220. The second air outlet 224 is aligned to the first air outlet 214, such that the airflow from the heat dissipation fan 220 passes through the second air outlet 224 and the first air outlet 214 sequentially and is guided to the outside.

Figure 5:
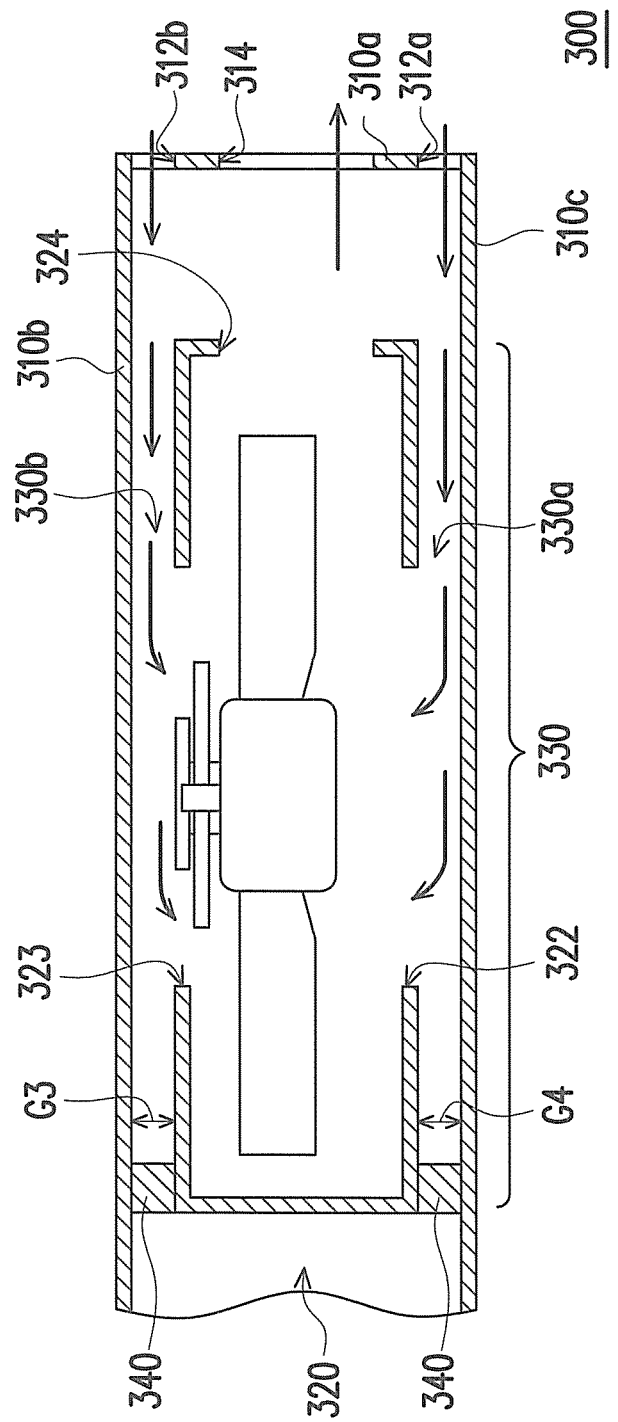
FIG. 5 is a partial schematic diagram illustrating an electronic device according to another embodiment of the present invention.

FIG. 5 is a partial schematic diagram illustrating an electronic device according to another embodiment of the present invention. Referring to FIG. 5, an electronic device 300 of the present embodiment is different from the electronic device 100 depicted in FIG. 2 and the electronic device 200 depicted in FIG. 4 in that blocks 340 of the present embodiment are illustrated as two, and the two blocks 340 are respectively filled in a gap between a top shell 310b and a heat dissipation fan 320 and a gap between a bottom shell 310c and the heat dissipation fan 320. The other configurations of the electronic device 300 are similar to those of the electronic device 100 and those of the electronic device 200, which are described as follows. A casing 330 of the electronic device 300 has a side shell 310a, the top shell 310b and the bottom shell 310c. One of the blocks 340 is filled in a gap G3 between the top shell 310b and the heat dissipation fan 320, while the other block 340 is filled in a gap G4 between the bottom shell 310c and the heat dissipation fan 320. As such, two channels 330a and 330b are respectively formed among one of the blocks 340, the top shell 310b of the electronic device 300 and the heat dissipation fan 320 and among the other block 340, the bottom shell 310c of the electronic device 300 and the heat dissipation fan 320. The channel 330a is extended between a first air inlet 312a at the side shell 310a and a second air inlet 322 of the heat dissipation fan 320, and the channel 330b is extended between a fourth air inlet 312b at the side shell 310 and a third air inlet 323 of the heat dissipation fan 320. As such, the airflow is guided to pass through the first air inlet 312a and the second air inlet 322 sequentially or pass through the fourth air inlet 312b and the third air inlet 323 sequentially to enter the heat dissipation fan 320. A second air outlet 324 of the heat dissipation fan 320 is aligned to a first air outlet 314 on the side shell 310b, such that the airflow from the heat dissipation fan 320 is guided to pass through the second air outlet 324 and the first air outlet 314 sequentially to the outside. With different product designs, the blocks 340 may be directly designed between the top shell 310b and the bottom shell 310c of the electronic device and contact the top shell 310b and the bottom shell 310c, but the present invention is not limited thereto.

Figure 6:
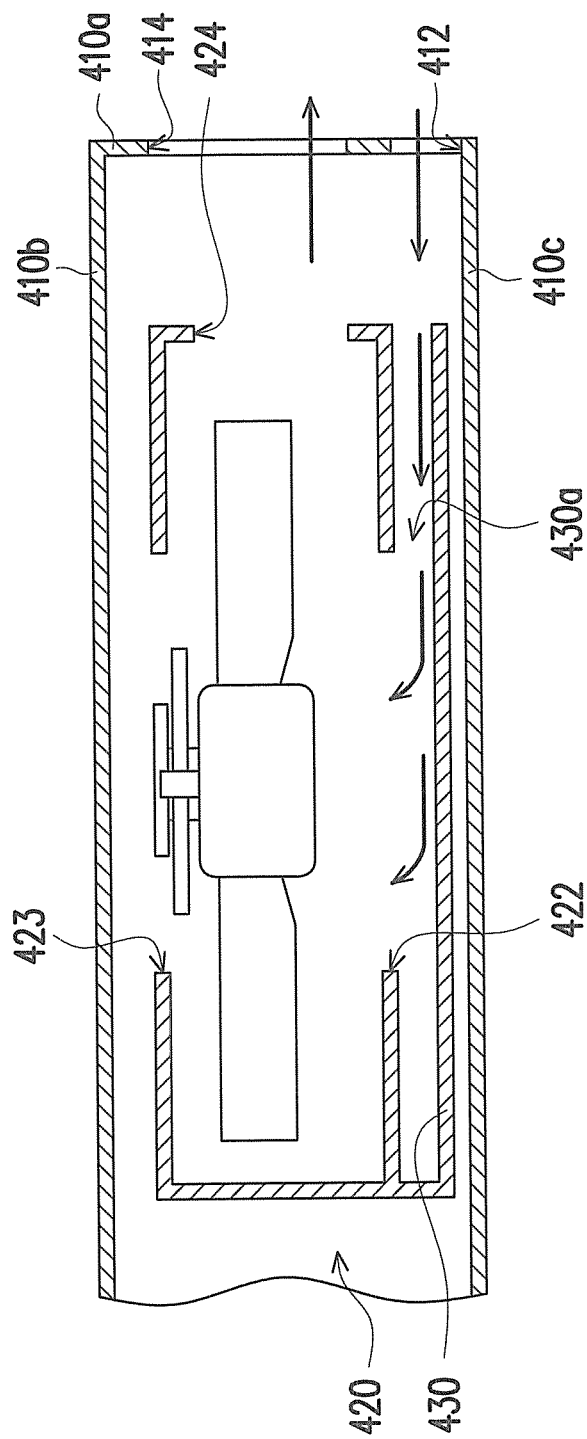
FIG. 6 is a partial schematic diagram illustrating an electronic device according to another embodiment of the present invention.

FIG. 6 is a partial schematic diagram illustrating an electronic device according to another embodiment of the present invention. Referring to FIG. 6, an electronic device 400 of the present embodiment is different from the electronic device 100, the electronic device 200 and the electronic device 300 in that there is a blocking wall 430 between a casing of a heat dissipation fan 420 and a bottom shell 410c of the electronic device 400, and the blocking wall 430 is connected with the heat dissipation fan 420 in the present embodiment. The blocking wall 430 is neither a part of a top shell 410b nor a part of a bottom shell 410c, but is a part of the casing of the heat dissipation fan 420. The other configurations of the electronic device 400 are similar to those of the electronic device 100, the electronic device 200 and the electronic device 300, which are described as follows. A channel 430a is formed between the blocking wall 430 and the casing of the heat dissipation fan 420 and extended between a first air inlet 412 on a side shell 410a and a second air inlet 422 of the heat dissipation fan 420. As such, the airflow is guided to pass through the first air inlet 412 and the second air inlet 422 sequentially to enter the heat dissipation fan 420. A second air outlet 424 is aligned to a first air outlet 414, such that the airflow from the heat dissipation fan 420 is guided to pass through the second air outlet 424 and the first air outlet 414 sequentially to the outside. With different product designs, the blocking wall 430 may also be integrated with the casing of the heat dissipation fan 420, but the present invention is not limited thereto.

Figure 7:
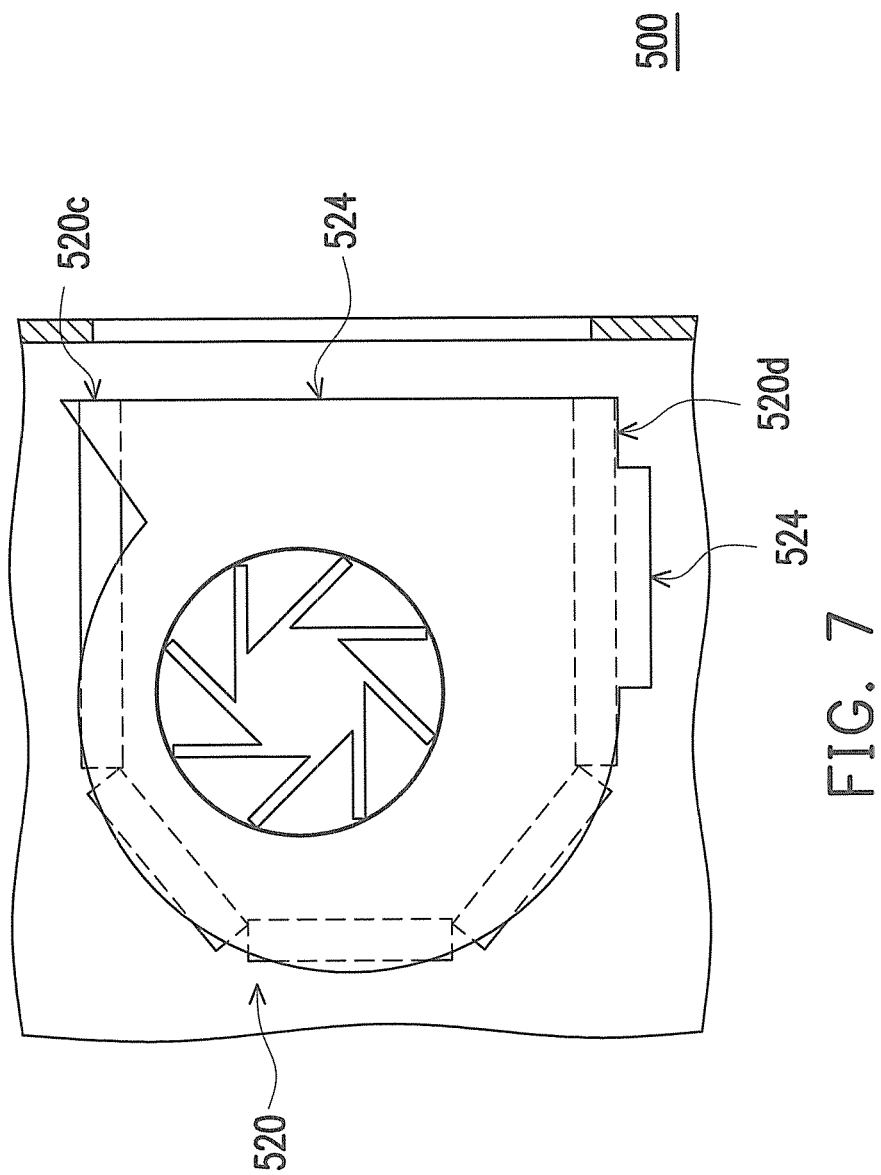
FIG. 7 is a top-view diagram illustrating an electronic device according to another embodiment of the present invention.

FIG. 7 is a top-view diagram illustrating an electronic device according to another embodiment of the present invention. Referring to FIG. 7, with comparison to the heat dissipation fan 120 depicted in FIG. 3 where only one second air outlet 124 is disposed, in an electronic device 500 of the present embodiment, a heat dissipation fan 520 has two second air outlets 524 respectively formed on a first side surface 520c and on a second side surface 520d of the heat dissipation fan 520, such that the heat dissipation fan 520 may have better air blowing efficiency.

Figure 8:
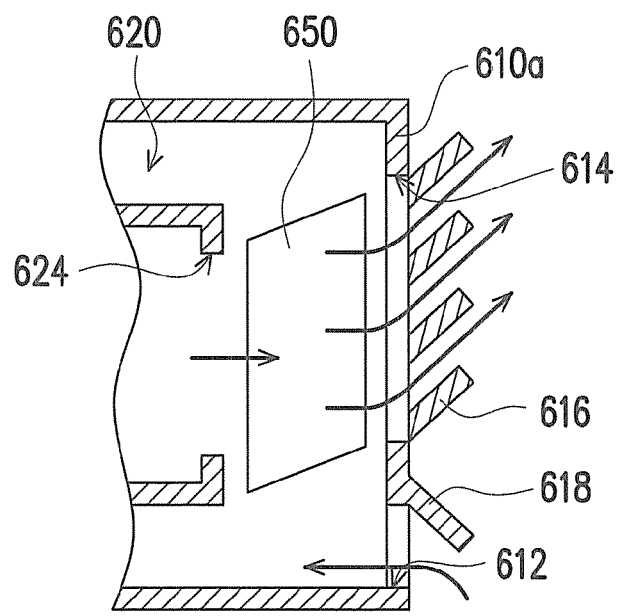
FIG. 8 is a schematic diagram illustrating an air outlet of an electronic device according to another embodiment of the present invention.

FIG. 8 is a schematic diagram illustrating an air outlet of an electronic device according to another embodiment of the present invention. Referring to FIG. 8, an electronic device 600 of the present embodiment is different from the electronic device 100 depicted in FIG. 2 in that a side shell 610a of the electronic device 600 has a first shielding plate 616 and a second shielding plate 618. The first shielding plate 616 is aligned to a first air outlet 614 of the electronic device 600 and tilts to hide the first air outlet 614, and the second shielding plate 618 is aligned to a first air inlet 612 of the electronic device 600 and tilts to hide the first air inlet 612. As such, the electronic device 600 may have a better appearance. Additionally, the first shielding plate 616 and the second shielding plate 618 tilting disposed are also capable of guiding the airflow, and the airflow passing through the first air outlet 614 is guided away from the first air inlet 612 by the first shielding plate 616. Accordingly, the heat passing through the first air outlet 614 will not approach the first air inlet 612, and thus, the airflow entering the electronic device 600 from the first air inlet 612 is lower tempered to enhance the heat dissipation efficiency. In order to avoid the heat generated from the first air outlet 614 from influencing the airflow passing through the first air inlet 612 to enter the electronic device. An included angle between the first shielding plate 616 and the second shielding plate 618 is greater than 30 degrees.

In the present embodiment, the electronic device 600 further includes a heat dissipation fins assembly 650 disposed between a second air outlet 624 of the heat dissipation fan 620 and a first air outlet 614 of the side shell 610a. The heat generated by a heat-generating element inside the electronic device 600 may be conducted to the heat dissipation fins assembly 650 by, for example, a heat-pipe, while the heat dissipation fins assembly 650 may be cooled by the airflow generated from the second air outlet 624 of the heat dissipation fan 620. Additionally, the heat dissipation fins assembly 650 of the present embodiment tilts, as shown in FIG. 8, such that the airflow passing through the heat dissipation fins assembly 650 is guided by the heat dissipation fins assembly 650 and the first shielding plate 616 and gets away from the first air inlet 612. Accordingly, the heat of the heat dissipation fins assembly 650 will not approach the first air inlet 612, and thus, the airflow entering the electronic device 600 from the first air inlet 612 is lower tempered to enhance the heat dissipation efficiency.

Figure 9:
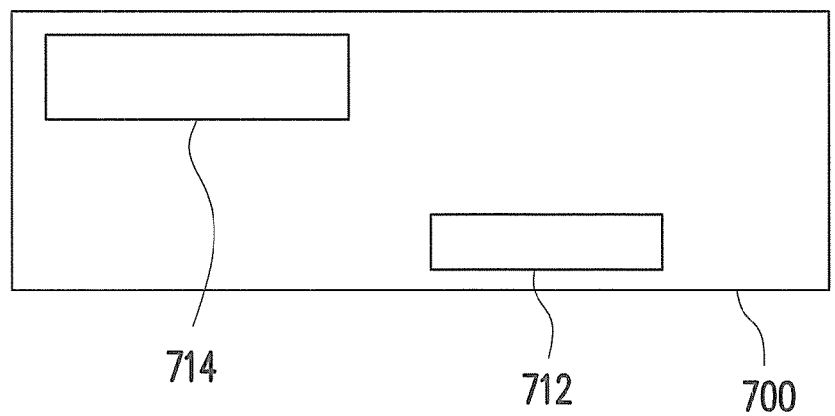
FIG. 9 is a side schematic diagram illustrating an electronic device according to another embodiment of the present invention.

FIG. 9 is a side schematic diagram illustrating an electronic device according to another embodiment of the present invention. Referring to FIG. 9, the electronic device 700 of the present embodiment features in that projections of the first air inlet 712 and the first air outlet 714 of the electronic device along an axial direction do not overlap with each other, which facilitates in positional designs of the air inlet and the air outlet of the electronic device. The axial direction is a normal vector of the plane of the top shell of the electronic device. In a typical design, the first air outlet 714 and the first air inlet 712 of the electronic device are configured on the positions which vertically overlap with each other, so as to exhaust the heat air from the heat dissipation fan out of the electronic device 700 and lead the cool air from the outside to enter the electronic device 700 as quickly as possible. Nevertheless, with the designs of the product appearance, projections of the first air inlet 712 and the first air outlet 714 along the axial direction may be configured to non-overlap or partially overlap by utilizing the design of the blocks in the present invention. Accordingly, without influencing the heat dissipation efficiency of the electronic device, the first air outlet 714 and the first air inlet 712 may be designed with the product appearance, and the appearance of the electronic device may be more esthetic.

In light of the foregoing, the first air inlet and the first air outlet of the electronic device of the present invention are concentrated on the side shell to avoid the appearance of the electronic device being influenced by the openings on places of the surfaces of the electronic device. In addition, the casing of the electronic device and the casing of the fan guide the airflow from the first air inlet of the side shell to the second air inlet of the heat dissipation fan, such that the heat dissipation fan has better air-intake efficiency. Further, since the bottom shell of the electronic device does not have any air inlet, the air does not enter the electronic device from the bottom thereof so as to avoid dusts from the outside being accumulated on the bottom of the electronic device as flowing with the air flow. Moreover, after the cool air from the outside enters the electronic device through the first air inlet, the cool air may flow toward the second air inlet of the heat dissipation fan along the bottom shell for cooling the bottom shell, so as to avoid the user's discomfort resulted from the overly high temperature of the bottom of the electronic device.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electronic device, comprising:
   a main body, having a side shell and a bottom shell, wherein the side shell has a first air inlet and a first air outlet;
   a heat dissipation fan, disposed in the main body and having at least one second air inlet and at least one second air outlet, wherein the second air outlet is aligned to the first air outlet; and
   at least one block, disposed in the main body to form a channel with the bottom shell and the heat dissipation fan, wherein the channel is extended between the second air inlet and the first air inlet to guide airflow to pass through the first air inlet and the second air inlet sequentially to enter the heat dissipation fan.

2. The electronic device according to claim 1, wherein the electronic device further comprises a top shell, wherein the side shell is connected between the top shell and the bottom shell, and the second air inlet faces toward the top shell or the bottom shell.

3. The electronic device according to claim 2, wherein the heat dissipation fan further comprises a third air inlet, and when the second air inlet faces toward the bottom shell, the third air inlet faces toward the top shell.

4. The electronic device according to claim 1, wherein the bottom shell has no openings.

5. The electronic device according to claim 2, wherein the block is adjacent to the heat dissipation fan and contacts the top shell and the bottom shell.

6. The electronic device according to claim 1, wherein a gap is between the heat dissipation fan and the bottom shell, and the block is filled in the gap.

7. The electronic device according to claim 6, wherein a material of the block is sponge, rubber or plastic.

8. The electronic device according to claim 1, wherein the heat dissipation fan has a top surface, a bottom surface and a first side surface, wherein the top surface is opposite to the bottom surface, the first side surface is connected between the top surface and the bottom surface, the second air outlet is formed on the first side surface, and the second air inlet is formed on the top surface or the bottom surface.

9. The electronic device according to claim 1, wherein the side shell has a first shielding plate, and the first shielding plate tilts relative to the side shell to hide the first air outlet.

10. The electronic device according to claim 9, wherein the side shell has a second shielding plate, and the second shielding plate tilts relative to the side shell to hide the first air inlet.

11. The electronic device according to claim 10, wherein an included angle between the first shielding plate and the second shielding plate is greater than 30 degrees.

12. The electronic device according to claim 9, wherein the first shielding plate guides the airflow passing through the first air outlet away from the first air inlet.

13. The electronic device according to claim 1, further comprising a heat dissipation fins assembly disposed between the second air outlet and the first air outlet.

14. The electronic device according to claim 13, wherein the heat dissipation fins assembly tilts, such that the heat dissipation fins assembly guides the airflow passing through the heat dissipation fins assembly away from the first air inlet.

15. The electronic device according to claim 1, wherein projections of the first air inlet and the first air outlet along an axial direction overlap with each other.

16. The electronic device according to claim 1, wherein projections of the first air inlet and the first air outlet along an axial direction do not overlap with each other.

17. The electronic device according to claim 1, wherein projections of the first air inlet and the first air outlet along an axial direction partially overlap with each other.

* * * * *